United States Patent [19]
Ohlsson et al.

[11] Patent Number: 5,075,678
[45] Date of Patent: Dec. 24, 1991

[54] METHOD AND APPARATUS FOR ANALOG-TO-DIGITAL CONVERSION

[75] Inventors: Thomas Ohlsson, Vaellingby; Bo Hjorth, Sollentuna, both of Sweden

[73] Assignee: Siemens Aktiengesellschaft, Munich

[21] Appl. No.: 662,403

[22] Filed: Feb. 28, 1991

[30] Foreign Application Priority Data

Mar. 2, 1990 [EP] European Pat. Off. ........ 90104107.9

[51] Int. Cl.⁵ ............................................. H03M 1/20
[52] U.S. Cl. ..................................... 341/131; 341/139; 341/155
[58] Field of Search ............... 341/118, 131, 139, 141, 341/155

[56] References Cited

U.S. PATENT DOCUMENTS

| | | | |
|---|---|---|---|
| 3,790,947 | 2/1974 | Campbell et al. | 341/131 |
| 4,129,864 | 12/1978 | Carpenter et al. | 341/139 |
| 4,751,496 | 6/1988 | Araki et al. | 341/131 |
| 4,851,842 | 7/1989 | Iwamatsu | 341/139 |
| 4,914,439 | 4/1990 | Naicahashi et al. | 341/131 |
| 4,926,175 | 5/1990 | Ishizawa et al. | 341/131 |

Primary Examiner—A. D. Pellinen
Assistant Examiner—Marc S. Hoff
Attorney, Agent, or Firm—Hill, Van Santen, Steadman & Simpson

[57] ABSTRACT

A method for analog-to-digital conversion includes the steps of applying a first transfer function to the input signal and amplifying the input signal by a defined gain factor to obtain an edited signal, subject chronologically successive samples of both the input signal and the edited signal to analog-to-digital conversion and thereby obtaining digital data having a defined number of bits corresponding to the input signal and digital data having a defined number of bits corresponding to the edited signal, multiplying the digital data corresponding to the input signal by a defined factor equal to the gain factor, applying a second transfer function to the digital data corresponding to the input signal by digital filtering, and undertaking calculations on the signals obtained in this manner to obtain a final analog-to-digital conversion result. An apparatus operating according to this method is also disclosed.

19 Claims, 3 Drawing Sheets

METHOD AND APPARATUS FOR ANALOG-TO-DIGITAL CONVERSION

FIELD OF THE INVENTION

The present invention is directed to a method and apparatus for analog-to-digital conversion of a chronologically changing analog electrical input signal.

RELATED APPLICATION

The subject matter of this application is related to the subject matter of an application filed simultaneously with the present application and having attorneys docket No. P91,0380, and assigned to the same assignee as the present application.

DESCRIPTION OF THE PRIOR ART

Analog-to-digital converters in the form of integrated circuits are currently available which operate, for example, according to the "dual slope" method, and permit analog-to-digital conversion of a chronologically changing analog electrical input signal with a resolution of up to 16 bits. The use of analog-to-digital converters for some purposes, such as electrocardiography (ECG) or electroencephalography (EEG), require that such converters be operated so that the smallest acquirable voltage difference of the signal to be measured (which corresponds to the least significant bit (LSB) of the analog-to-digital conversion) is on the order of magnitude of a few microvolts. Under such conditions, known analog-to-digital converters have an extremely limited dynamic range for the signal to be measured. This results in the analog-to-digital converter being very quickly overdriven by the signal to be measured. This is particularly undesirable in the case of electrocardiography, wherein registration of an electrocardiogram should be possible immediately after a defibrillation. To effect defibrillation, the heart of a patient is charged with pulses having relatively high voltage and current intensity. It is conceivable to alleviate the problem of overdriving the analog-to-digital converter by using analog-to-digital converters having higher resolution (number of bits). If the analog-to-digital converter is to be executed as an integrated circuit, the manufacture of such an integrated converter having a sufficiently high resolution is extremely expensive, and the alternative of using a discretely constructed analog-to-digital converter involves a considerable technological and financial outlay.

Such outlay can be at least partially avoided by using so-called DAC feedback. Using this known technique, the digital output signals of the analog-to-digital converter are supplied to an electronic calculating means, which drives a digital-to-analog converter connected to the electronic calculating means so that it generates an analog output signal, which is then subtracted in a differential amplifier from the signal to be measured. The output from the differential amplifier is supplied to the analog-to-digital converter. The digital-to-analog converter is driven by the electronic calculating means dependent on the momentary amplitude of the signal to be measured, so that the output of the differential amplifier does not exceed the dynamic range of the analog-to-digital converter. The digital data corresponding to the output signal of the differential amplifier are subsequently corrected in the electronic calculating means by adding the corresponding value of the output signal of the digital-to-analog converter thereto. Exact results are only obtained with this method, however, if the resolution (number of bits) of the digital-to-analog converter corresponds to the desired resolution of the analog-to-digital conversion. Problems similar to those described above in conjunction with analog-to-digital converters also occur in digital-to-analog converters, therefore digital-to-analog converters are usually employed having a resolution which is lower than the desired desired resolution of the analog-to-digital conversion. This results in imprecisions in the conversion. For example, the results of the analog-to-digital conversion contain discontinuities which are not present in the analog input signal. A further disadvantage of this known technique is the necessity of an additional digital-to-analog converter, which results in additional costs.

SUMMARY OF THE INVENTION

It is an object of the present invention to provide a method and apparatus for analog-to-digital conversion of a chronologically changing, analog electrical input signal which are technologically simple and economic, which have a large dynamic range, and which permit the measurement of extremely small voltage changes.

It is further object of the present invention to provide such a method and apparatus which are suitable for analog-to-digital conversion of electrocardiographic signals.

The above objects are achieved in a method in accordance with the principles of the present invention wherein the final result of the analog-to-digital conversion is calculated using digital data corresponding to an edited signal, acquired from the input signal by applying a first transfer function to the input signal and amplifying the input signal by a defined gain factor, and digital data corresponding to the input signal which are multiplied by a defined factor corresponding to the defined gain factor. As a consequence of, among other things, the use of the defined gain factor in the editing of the input signal, a modification of the result of the analog-to-digital conversion by one LSB in the analog-to-digital conversion of the edited signal corresponds to a voltage change of the input signal which derives from the division of the voltage difference corresponding to a LSB by the defined gain factor. The digital data corresponding to the input signal multiplied by the defined factor are subjected to a second transfer function by digital filtering. This results in an "interpolation" ensuing between data corresponding to the input signal which are separated by a LSB from one another. This result is described in more detail in the text "Theory and Application of Digital Signal Processing," Rabiner et al.

When, using both the digital data corresponding to the edited signal and the digital data corresponding to the digitally filtered input signal, the results of the analog-to-digital conversion are then calculated, digital data are then obtained as sum whose number of bits, as a consequence of the above steps, is higher than the number of bits of the analog-to-digital conversion, by a degree which yields the defined gain factor. In the case, for example, of a gain factor of 32, an increase of 5 in the number of bits then derives, whereas a defined gain factor of 16 would yield an increase of only 4 bits. Given the condition that the dynamic range of the edited signal is less than the dynamic range of the input signal essentially by a factor at least corresponding to the defined gain factor, (this being a prerequisite that transgressions of the dynamic range of the analog-to-digital conversion with respect to the edited signal are not possible), the method disclosed herein allows the input signal to be subjected in a technically simple and economic manner to analog-to-digital conversion which has a large dynamic range, and which simultaneously permits the measurement of extremely small voltage changes.

An embodiment of the invention which is of particular advantage for electrocardiography uses high-pass filtering of the input signal as the first transfer function. This insures that the edited signal correctly reproduces the dynamic part of the signal, even after defibrillation, without transgressions of the dynamic range, because those signal parts of the input signal which correspond to the tissue polarization caused by the defibrillation are filtered out.

In an further embodiment of the invention, the complex complement of the first transfer function is applied to the digital data corresponding to the input signal which have been multiplied by the defined factor. The digital data obtained in this manner are added to the digital data corresponding to the edited signal, and those signal portions which were removed by the application of the first transfer function are again attached to the digital data corresponding to the edited signal. It is thus assured that the results of the analog-to-digital conversion take all signal portions of the input signal into consideration.

If it is expected that transgressions of the dynamic range of the converter will occur in the analog-to-digital conversion of the edited signal, a different set of digital data can be obtained in an embodiment of the invention without taking the edited signal into consideration. This is accomplished by superimposing a chronologically changing analog electrical signal on the input signal before the analog-to-digital conversion, with the maximum amplitude of the superimposed signal being at least equal to the voltage difference which corresponds to a least significant bit (LSB) in the analog-to-digital conversion of the input signal. The superimposed signal has a statistically uniform amplitude distribution. Following the analog-to-digital conversion, a third transfer function is then applied by digital filtering to the digital data corresponding to the signal resulting from the combination of the input signal and the superimposed signal. The third transfer function has an integrating effect.

Without taking the digital data which correspond directly to the edited signal into consideration in calculating the conversion result, one obtains digital data as a result of the analog-to-digital conversion whose number of bits is higher than the number of bits in the analog-to-digital conversion. The reason for this is that again an "interpolation" ensues between digital data which are separated from one each other by one LSB, which correspond to the input signal and which are multiplied by the defined factor. This ensues by the application of the integrating transfer function, which is undertaken by digital filtering. The time constant of the integration is preferably selected so that the integration covers digital data corresponding to the defined gain factor. The digital data are then used as digital data corresponding to the input signal, but have a number of bits which is larger by 5 bits than the number of bits of the analog-to-digital conversion given, for example, a gain factor of 32. The analog signal, for example, may be a periodic signal, for example a sawtooth signal, or of a non-periodic signal, for example noise. The only important factor is that the signal has a statistically uniform amplitude distribution. Because the method in this embodiment of the invention has somewhat less precision in comparison to the aforementioned embodiments, particularly in view of the dynamic part of the input signal, this embodiment should only be used under the circumstances wherein the unique advantages thereof are required. An apparatus operating according to the above method is also disclosed herein. A method for calibrating the disclosed apparatus is also disclosed which permits the defined gain factor and the defined multiplication factor to be exactly matched to each other, and if necessary permits tuning of the second transfer function to the first transfer function to be undertaken to assure that the second transfer function in fact represents the complex complement of the first transfer function.

DESCRIPTION OF THE PREFERRED EMBODIMENTS

Figure 1:
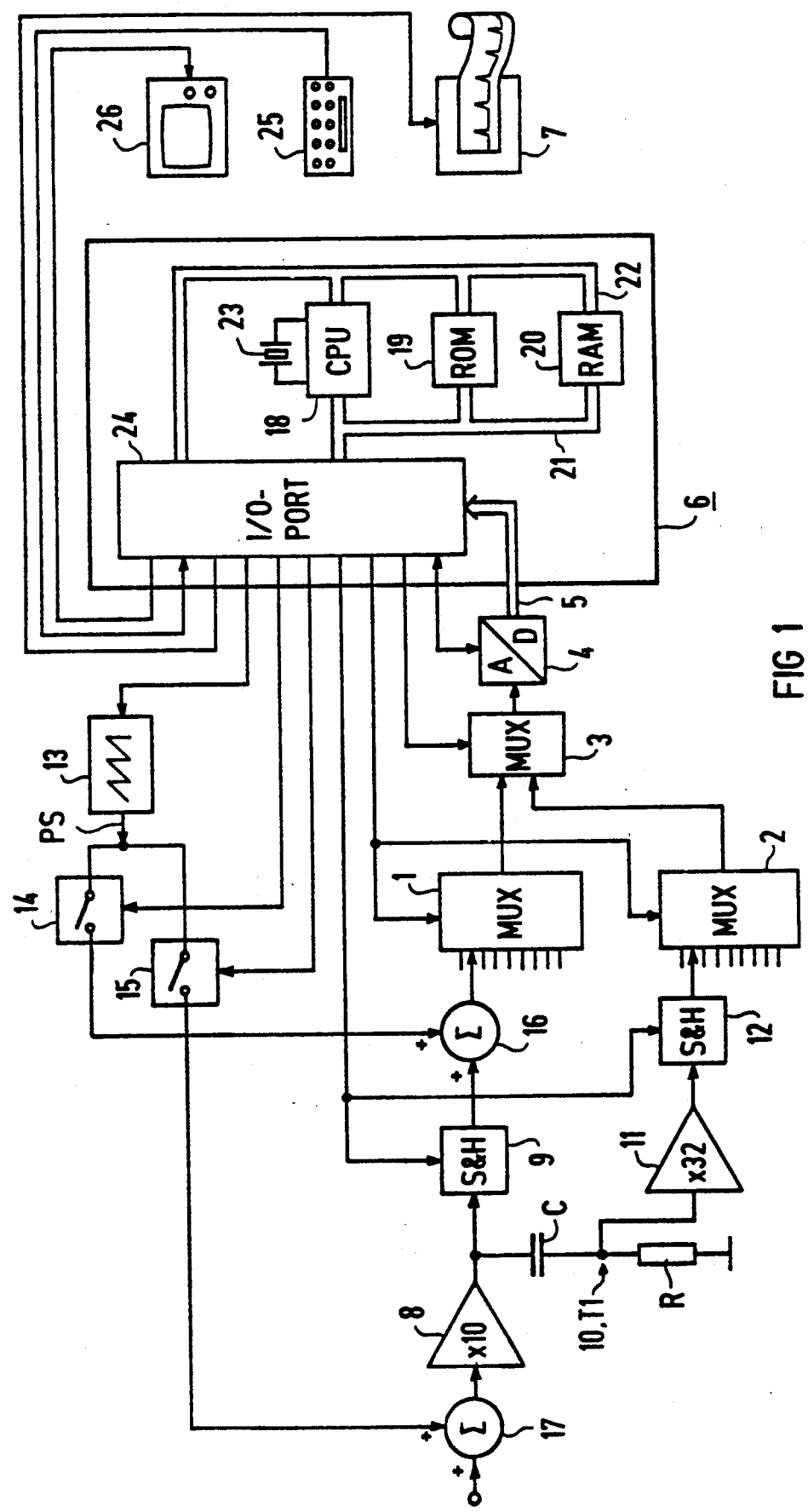
FIG. 1 a block circuit diagram of an apparatus constructed in accordance with the principles of the present invention for practicing the method of the present invention.

The apparatus shown in FIG. 1 may be a component, for example, of a means for processing and recording electrocardiographic signals. The apparatus of FIG. 1 includes a first 9:1 channel analog multiplexer 1. Usually nine ECG contacts are used (not shown, but including three contacts for the extremities and three contacts for the chest). These ECG contacts are respectively allocated to the inputs of the multiplexer 1. A second multiplexer 2, also a 9:1 channel analog multiplexer, is in parallel with the first multiplexer 1, for the purpose described below. The output of the two multiplexers 1 and 2 are connected to the inputs of a 2:1 channel analog multiplexer 3. The output signal of the multiplexer 3 is supplied to the input of an analog-to-digital converter 4 which is a 14-bit converter. The digital output data of the converter 4 proceed via a data bus 5 to an electronic calculating unit 6 in which they are further processed. A recorder 7, which may be an ECG strip plotter, is connected to an output of the calculating unit 6.

The signals corresponding to the individual ECG contacts do not proceed directly to the input of the first multiplexer 1. Instead, as shown in FIG. 1 with respect to one exemplary channel, the signals pass through an amplifier 8, which in the exemplary embodiment of FIG. 1 has a gain of 10. The output signal of the amplifier 8 is supplied to a sample and hold circuit 9. The output of the sample and hold circuit 9 is connected to an input of the first multiplexer 1. The output signal of the amplifier 8 is also supplied to a high-pass filter 10 of the first order, formed by a capacitor C and a resistor R.

The high-pass filter 10 applies a first transfer function T1 to the signal supplied to it, this first transfer function T1 being that of the high-pass filter 10 itself. The limit frequency of the high-pass filter 10 is selected sufficiently low to avoid suppression of diagnostically relevant, low-frequency parts of the input signal.

The output of the high-pass filter 10 proceeds to a second amplifier 11, having a gain factor V=32 in the exemplary embodiment. The output of the second amplifier 11 is supplied to a second sample and hold circuit 12, whose output is connected to one of the inputs of the second multiplexer 2, i.e., to that input corresponding to the input of the first multiplexer 1 which is connected to the first sample and hold circuit 9 associated with the respective channel. In the case of the exemplary embodiment of FIG. 1, the sample and hold circuits 9 and 12 are respectively connected to the second input (counted from the top) of the multiplexers 1 and 2. The sample and hold circuits 9 and 12 can be eliminated if it is assured that the repetition rate of the analog-to-digital conversions for each channel of the apparatus is clearly above the highest signal frequency of interest, or above the upper limit frequency of the supplied signal.

Even though it has been amplified in the amplifier 8, the signal supplied to the first sample and hold circuit 9 shall be referred to below as the input signal ES. The signal acquired from the input signal ES by removing the DC voltage components thereof with the high-pass filter 10 and by amplification by the defined gain factor V in the amplifier 11, and which is supplied to the second sample and hold circuit 12, shall be referred to as edited signal AS.

Via control lines, the multiplexers 1, 2 and 3 and the sample and hold circuits 9 and 12 are connected to the electronic calculating unit 6, from which they receive control signals. The multiplexers 1 and 2 are driven via a common control line so that the individual inputs thereof are respectively connected to the output in periodic succession, this operation being cyclically repeated. During the time interval for which the inputs of the multiplexers 1 and 2 associated with a defined ECG contact are connected to the respective outputs of the multiplexers 1 and 2, the calculating unit 6 supplies an inhibit signal to the respective sample and hold circuits 9 and 12 via a common control line. This assures that the voltage at the respective inputs of the multiplexers 1 and 2 does not change during this time interval.

The multiplexer 3 is controlled by the calculating unit 6 so that the multiplexer 3 connects the output of the multiplexer 1 to the input of the analog-to-digital converter 4 for one-half of the aforementioned time interval, and connects the output of the multiplexer 2 to the input of the analog-to-digital converter 4 for the other half of the time interval. The time interval is selected sufficiently long to enable the analog-to-digital converter 4 to undertake an analog-to-digital conversion during the respective halves of the time interval. The analog-to-digital converter 4 is connected to the calculating unit 6, which supplies the analog-to-digital converter 4 with a pulse at a suitable time. This pulse initiates the beginning of an analog-to-digital conversion. The analog-to-digital converter 4 generates an output signal supplied to the calculating unit 6, via the same line used to supply the control signal to the converter 4, when the converter 4 completes an analog-to-digital conversion. In the exemplary embodiment of FIG. 1, the calculating unit 6 supplies the pulses which respectively initiate the analog-to-digital conversions with a repetition rate so that aliasing effects are avoided. The analog-to-digital converter 4 thus supplies the calculating unit 6 with a stream of digital data, which is obtained by the alternating, quasisimultaneous analog-to-digital conversion of the input signal ES and of the edited signal As of the ECG contacts corresponding to the individual channels. The digital data resulting from each conversion have the same number of bits, namely 14 bits.

As also shown in FIG. 1, a signal generator 13 is provided which generates a periodic signal PS having a statistically uniform amplitude distribution, for example a sawtooth signal. The periodic signal PS can be supplied to summing stages 16 and 17 via respective switches 14 and 15 which are actuatable by the calculating unit 6 via corresponding control lines. The summing stage 16 lies between the output of the sample and hold circuit 9 and the inputs of the multiplexer 1, and the summing stage 17 lies between the apparatus input and the input to the amplifier 8. There is thus the possibility of selectively overlaying the periodic signal PS on the samples of the input signal ES, or on the signals supplied to the amplifier 8. The frequency of the periodic signal PS is preferably selected so that its period duration corresponds to the time which is required for a plurality of analog-to-digital conversions of related samples of the input signal ES and of the edited signal AS, the plurality of related samples corresponding in number to the defined gain factor V. To achieve the required synchronization, the signal generator 13 is connected to the calculating unit 6 via a control line.

The electronic calculating unit 6 is constructed in a known manner and includes a central processing unit (CPU) 18, a read-only memory (ROM) 19 and a random access memory (RAM) 20, which are connected to each other via an address bus 21 and via a data bus 22. The ROM 19 and the RAM 20 serve the purpose of storing the operating system, the actual program and variable data. A crystal 23 is connected to the CPU 18, the crystal 23 generating clock signals which are required for operating the calculating unit 6 and from which the control signals for the multiplexers 1, 2, 3, the analog-to-digital converter 4, the sample and hold circuits 9 and 12, and the signal generator 13 are derived. These signals proceed via an input/output circuit (I/O port) 24 to these respective components. The input/output circuit 24 is connected both to the address bus 21 and the data bus 22. A data bus 5, via which the digital output signals of the analog-to-digital converter 4 proceed to the electronic calculating unit 6, is also connected to the input/output circuit 24. A keyboard 25, and a data display 26 and the aforementioned recording unit 7 are also connected thereto.

Figure 2:
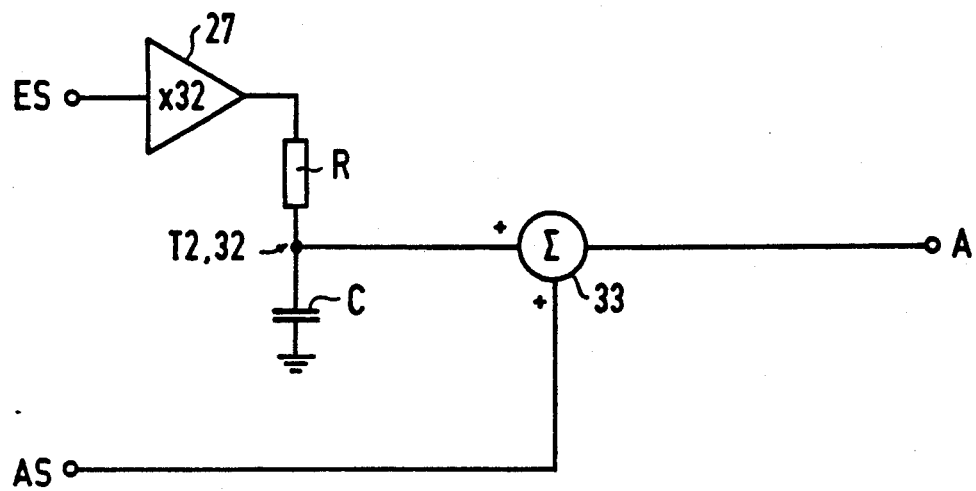
FIG. 2 is a circuit diagram illustrating a first operating mode for the apparatus of FIG. 1.
Figure 3:
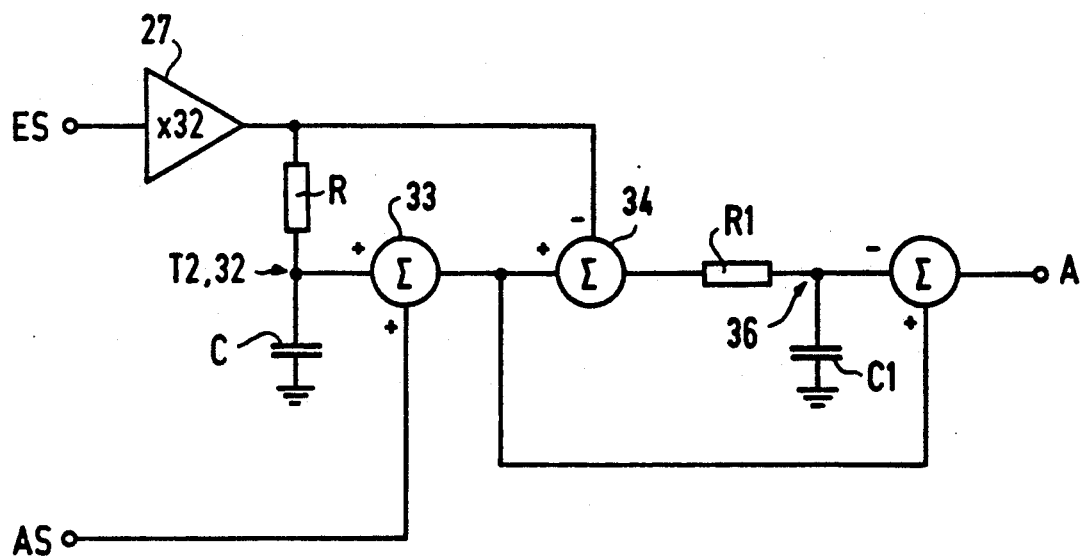
FIG. 3 is a circuit diagram illustrating a second operating mode of the apparatus of FIG. 1.

The digital data corresponding to the input signals ES and to the edited signals AS are processed in the calculating unit 6 so that, first, input signals ES can be converted with full exploitation of the dynamic range of the analog-to-digital converter 4 and, second, so that voltage changes of the input signal ES are smaller than that voltage change which would effect a change in the result of the analog-to-digital conversion by one LSB, given direct routing of the input signal ES to the input of the analog-to-digital converter 4, and without subsequent processing of the digital output data of the analog-to-digital converter 4. This shall be set forth below with reference to one channel in the embodiment FIG. 1, with reference to analog circuits respective shown in FIGS. 2 and 3. The analog circuits shown in FIGS. 2 and 3 illustrate the program executed by the calculating unit 6, insofar as it involves the processing of the data supplied to the calculating unit 6 from the analog-to-digital converter 4. FIGS. 2 and 3 are for explanatory purposes only, and should not be misinterpreted as meaning that an analog computer may be employed instead of the calculating unit 6 which is a digital computer. This would not be possible because the digital data supplied to the calculating unit 6 by the analog-to-digital converter 4 are already in digital form, and thus not capable of being processed with analog circuitry.

The electronic calculating unit 6 basically multiplies the digital data corresponding to the input signal ES, which are supplied by the analog-to-digital converter 4 and which have been obtained by the analog-to-digital conversion of the output signal of the sample and hold circuit 9, by a defined factor F. The factor F corresponds to the gain factor V with which the output signal of the high-pass filter 10 is amplified in order to acquire the edited signal AS. In the exemplary embodiment, the defined factor F is 32. This is indicated in FIG. 2 by an amplifier 27 having a gain of 32.

In the preferred operating mode of the apparatus, the electronic calculating unit 6 subjects the digital data, which correspond to the input signal and are multiplied by the factor F, to a second transfer function T2 by digital filtering. The second transfer function T2 is the complex complement of the first transfer function T1 which was used to eliminate DC voltage components from the input signal ES for forming the edited signal AS. In chronologically correct relationship, the calculating unit 6 adds the digital data obtained from the digital filtering to the digital data obtained by the analog-to-digital conversion of the edited signal AS. The result of this addition represents the result of the overall analog-to-digital conversion, and is used as such by the calculating unit 6.

As is known, a mathematical function and its complex complement have the property that, when they are respectively multiplied by a third mathematical function, the sum of the products obtained in this manner corresponds to the third mathematical function. In the present case, this means that those signal parts which were lost when passing through the high-pass filter 10 are again "attached" to the edited signal AS as a result of this addition. This results in the DC components contained in the input signal ES being taken into consideration. Since an "interpolation" also occurs in the digital filtering between digital data corresponding to the input signal ES which are separated from each other by one LSB, the advantage is obtained that the digital data arising due to the aforementioned addition have a number of bits (given adequate precision of the calculating events undertaken in conjunction with the digital filtering) which is larger than the number of bits of the analog-to-digital converter 4. In the case of the exemplary embodiment, wherein the defined gain factor V and the defined factor F each have a value of 32, the calculating unit 6 executes the calculating events required for digital filtering with such precision that an increase of 5 in the number of bits (14) of the analog-to-digital conversion occurs, so that a total of 19 bits results.

In the exemplary embodiment, the input signal ES passes through the high-pass filter 10 of the first order for forming the edited signal AS. The complex complement of the transfer function T1 is used as the transfer function T2, which is realized by a low-pass filter of the first order whose limit frequency is identical to the limit frequency of the high-pass filter 10.

It should be noted that this will not be valid if a high-pass filter of a higher order is used instead of a high-pass filter of the first order. (If this is the case, correction elements must be added to the transfer function of the corresponding low-pass filter in order to obtain the complex complement.) The transfer function T1 need not necessarily be that of a high-pass filter. Under certain circumstances, the transfer function T1 may be that of a low-pass filter or a bandpass filter. In this case, the transfer function T2 must still represent the complement of the transfer function T1, i.e., the transfer function of a high-pass filter or of a notch filter.

The described operating mode is illustrated in FIG. 2 by the representation of a low-pass filter 32 of the first order formed by a resistor R and a capacitor C, the values thereof corresponding to the R and C values for the high-pass filter 10. The low-pass filter 32 is connected to the output of the amplifier 27, the output thereof being added to the edited signal AS in a summing stage 33. Following the summing stage 33, a signal is available which, because those signal components which were previously removed with the high-pass filter 10 have been added again to the edited signal AS, corresponds to the input signal ES amplified by a factor of 32. It is therefore clear that the results of the analog-to-digital conversion acquired by the summation of the digital data corresponding to the edited signal AS, and the digital data obtained by applying the second transfer function T2 to the digital data multiplied by the factor F and corresponding to the input signal ES, offer an enhanced resolution corresponding to the defined gain factor V or to the defined factor F and nonetheless correctly contain the DC voltage components contained in the input signal ES.

The following is a numerical example of the above-described apparatus in accordance with the inventive method. If, for example, a signal having a dynamic range of $\pm 320$ mV is to be measured with a resolution of approximately 1.25 $\mu$V with the 14-bit analog-to-digital converter 4, this is clearly not possible because the smallest voltage difference measurable with the analog-to-digital converter 4 is approximately 40 $\mu$V. In accordance with the principles of the present invention, however, the dynamic part of the input signal ES is amplified by the gain factor V=32 in the formation of the edited signal AS, so that voltage differences of 40 $\mu$V/32=1.25 $\mu$V are measurable with respect to the dynamic part, or with respect to the edited signal AS. By the application of the transfer function T2 to the digital data which correspond to the input signal ES, and multiplication by the factor F=V=32 by digital filtering, the calculating events required for the digital filtering are executed with such precision that an increase in the number of bits of the analog-to-digital conversion by 5 bits occurs, for a total of 19 bits. In this case, the smallest voltage difference measurable in the analog-to-digital conversion of the input signal likewise corresponds to approximately 1.25 $\mu$V.

Slight imprecisions may occur due to an offset voltage, caused by the amplifier 11, being superimposed on the edited signal AS, which falsifies the results of the analog-to-digital conversion. These imprecisions can be avoided in a second operating mode of the apparatus. For interrelated samples of the input signal ES and the edited signal AS, the calculating unit 6 in this second operating mode calculates, with the correct operational sign, the difference between the digital data corresponding to the input signal ES multiplied by the defined factor F, and the sums obtained by the addition of the digital data corresponding to the edited signal AS and by the application of the second transfer function T2 to the digital data corresponding to the input signal ES multiplied by the defined factor F. The calculating unit 6 forms the average value of the differences calculated for, for example, 256 successive samples, taking their operational signs into consideration. The calculating unit 6 substracts this average value from the digital data corresponding to the sum which was most recently considered in the calculation of the average value. The aforementioned imprecisions caused by the offset voltage of the amplifier 11 are thus avoided. The formation of the average value, however, is not absolutely necessary and may be eliminated.

In FIG. 3, which otherwise corresponds to FIG. 2, the described correction of the offset voltage of the amplifier 11 is illustrated in that the amplified input signal ES is subtracted from the output signal of a summing stage 33 at a summing stage 34. The signal corresponding to the offset voltage of the amplifier 11 proceeds from the summing stage 34 to an RC element 36, having an integrating effect, which is formed by a resistor R1 and of a capacitor C1 connected to ground. Formation of the average value is achieved with this RC element 36. The average value stored in the capacitor C1 is subtracted from the output signal of the summing stage 33 at a summing stage 35.

In a further operating mode of the apparatus, the signal generating 13, which generates a sawtooth signal PS, is used. In this operating mode, the electronic calculating unit 6 closes the switch 14 with an appropriate signal, so that the sawtooth signal PS is superimposed on the input signal ES at the summing stage 16. The maximum amplitude of the sawtooth signal PS is at least equal to the voltage difference which causes a change in the output data of the analog-to-digital converter 4 by one LSB. The duration of the period of the sawtooth signal PS is selected so that the analog-to-digital converter 4 undertakes a defined number of analog-to-digital conversions during the curve of the sawtooth signal PS along its linear edge S from one extreme value to the other extreme value of its amplitude. The defined number of analog-to-digital conversions is preferably equal to the defined gain factor V. In the described exemplary embodiment, it thus amounts to 32.

As a consequence of the superimposing of the sawtooth signal PS on the input signal ES in the summing stage 16, a step signal arises at the output of the sample and hold circuit 9, which proceeds via the multiplexers 1 and 3 to the analog-to-digital converter 4. The output data of the analog-to-digital converter 4 will change by at least one LSB during the course of the sawtooth signal PS along its linear edge S, leaving out of consideration the special case wherein the maximum amplitude of the signal PS is equal to the voltage difference which causes a change in the output data of the analog-to-digital converter 4 by one LSB, and also leaving out the special cases wherein the minimum or maximum amplitude of the signal obtained by the superimposition of the signal PS on the signal ES exactly corresponds to a voltage value measurable with the analog-to-digital converter 4.

The calculating unit 6 subjects the output data of the analog-to-digital converter 4, resulting from the analog-to-digital conversion of the input signal ES with the sawtooth signal PS superimposed thereon, to a fourth transfer function having an integrating effect. The integral of the output data of the analog-to-digital converter is thus formed for the output data which most recently continuously occurred in the defined plurality of analog-to-digital conversions. In this integration, the calculating unit 6 takes the maximum amplitude of the sawtooth signal PS, and the position of the sawtooth signal PS relative to the input signal ES after superimposition, into consideration as boundary conditions.

As a result of the integration, and thus as a result of the analog-to-digital conversion of the input signal ES, the calculating unit 6 then supplies digital data having a number of bits greater than the number of bits of the analog-to-digital converter. The number of bits thus increases corresponding to that number of analog-to-digital conversions which are undertaken during the time wherein the amplitude of the sawtooth signal PS along its linear edge changes by a value leading to a change in the output data of the analog-to-digital converter 4 by one LSB. If, as in the case of the described exemplary embodiment, the maximum amplitude of the sawtooth signal PS is equal to one LSB, and if 32 analog-to-digital conversions are undertaken during one period of the sawtooth signal PS, the number of bits of the results of the analog-to-digital conversion obtained according to this operating mode is increased from 14 to 19 bits. This operating mode is particularly of interest if the dynamic range of the analog-to-digital converter 4 is exceeded in the conversion of the edited signal AS in either of the operating modes previously described as illustrated in FIGS. 2 and 3. The electronic calculating unit 6 detects such transgressions, which can be recognized if all bits of the output data of the analog-to-digital converter 4 have the value of logic "1", and thus switches the apparatus to the just-described operating mode by closing the switch 14.

Figure 4:
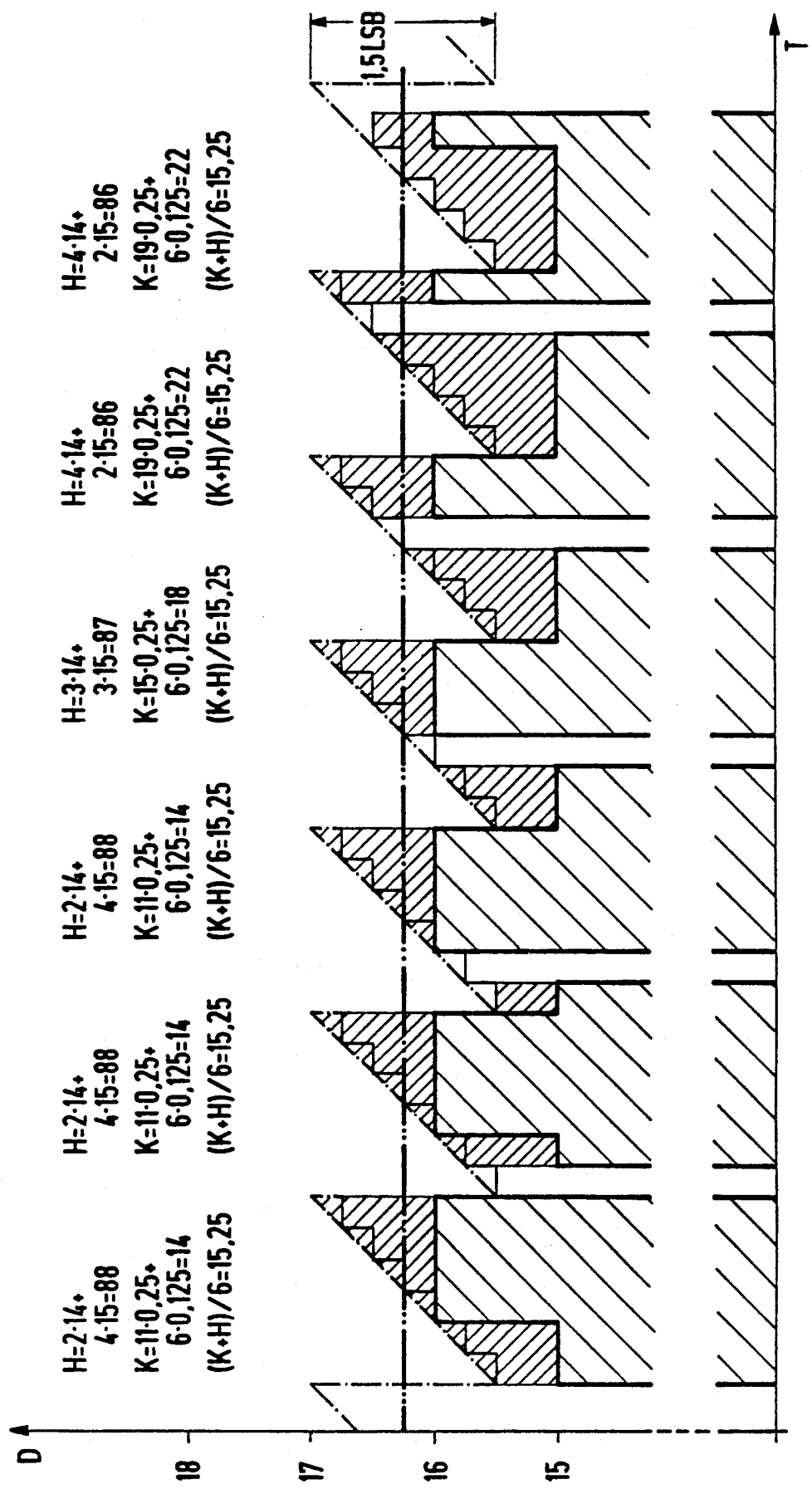
FIG. 4 a diagram for explaining a third operating mode of the apparatus of FIG. 1.

The just-described operating mode of the apparatus is illustrated in FIG. 4, which is a diagram wherein a constant input signal ES is symmetrically superimposed with a sawtooth signal PS, entered with a dot-dash line, having an amplitude of 1.5 LBS. Six analog-to-digital conversions are undertaken during one period of the sawtooth signal PS. This means that four analog-to-digital conversions are undertaken during that time wherein the amplitude of the sawtooth signal PS changes by one LSB. As shown with reference to six typical integration fields, the integration respectively occurs over the output data D of six successive analog-to-digital conversions. In the integration, the calculating unit 6 first forms the sum H of six successively arising output data of the analog-to-digital converter 4. The sum H is identified by the area shaded by lines rising from left to right in FIG. 4. The number K of more significant output data of the analog-to-digital converter 4 is determined, on the basis of which the calculating unit 6 calculates the areas identified by shading with lines descending from left to right in FIG. 4. This takes place on the basis of an algorithm which is adapted to the particular conditions, which those skilled in the art can easily locate. For each integration event, the calculating unit 6 adds the values H and K, and divides them by the number of analog-to-digital conversions which were undertaken in the duration of the period. The result of the division corresponds to the result of the analog-to-digital conversion and, in the embodiment of FIG. 4, amounts to 16.25.

It can be seen that the signal which is superimposed on the input signal ES may be a signal of arbitrary wave form such as a noise signal, as long as it has a statistically uniform amplitude distribution.

In a last operating mode, which serves the purpose of calibrating or balancing the apparatus of the invention, the sawtooth signal PS is supplied to the summing stage 17 by the electronic calculating unit 6 closing the electronic switch 15, with the electronic switch 14 being open. The sawtooth signal PS is thus superimposed on the input signal ES as well as on the edited signal AS. The calculating unit 6 then calculates, first, the results of the analog-to-digital conversion with reference to the input signal ES in the manner set forth in conjunction with FIG. 4. Second, the calculating unit 6, parallel to this operation, calculates the results of the analog-to-digital conversion in the operating modes set forth in conjunction with FIG. 2, whereby the corrections set forth in conjunction with FIG. 3 with respect to the offset voltage of the amplifier 11 are undertaken. An arbitrary signal, which need only satisfy the condition of not transgressing the dynamic range with respect to the edited signal AS, is then supplied to the apparatus. It is also possible to short-circuit the input of the apparatus, so that the input signal ES has the value of zero. The calculating unit 6 then compares the results of the analog-to-digital conversion, calculated by using the digital data corresponding to the edited signal AS, to the results of the analog-to-digital conversion calculated only using digital data corresponding to the input signal ES and multiplied by the factor F, without considering the digital data corresponding to the edited signal AS. A difference value is obtained as a result of this comparison. In the ideal case, the differences will reproduce the curve of the sawtooth signal PS, because this is interpreted as a single component when calculating the results of the analog-to-digital conversion using the digital data corresponding to the edited signal AS, but is only employed as an auxiliary signal in the case of the analog-to-digital conversion of the input signal ES. When the differences formed by the calculating unit 6 significantly deviate from the sawtooth signal PS, adjustment or balancing of the apparatus can be undertaken. Such adjustment or balancing may be achieved, for example, by adapting the third transfer function T3 to the component values of the high-pass filter 10, by correcting the gain factor V if this is variable, or by correcting the defined factor F.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for analog-to-digital conversion of a chronologically changing, analog electrical input signal comprising the steps of:
    forming an edited signal by subjecting said input signal to a first transfer function to obtain a resulting signal, and amplifying the resulting signal by a defined gain factor;
    chronologically successively sampling said input signal and said edited signal to obtain a sampled input signal and a sampled edited signal;
    subjecting the sampled input signal to an analog-to-digital conversion to obtain first digital data having a defined number of bits;
    subjecting the sampled edited signal to an analog-to-digital conversion to obtain second digital data having said defined number of bits;
    multiplying said first digital data by a defined multiplication factor, equal to said defined gain factor to obtain a product;
    subjecting said product to a second transfer function by digitally filtering said product to obtain digital filtered data; and
    calculating a final analog-to-digital conversion result based on said digital filtered data and said second digital data.

2. A method as claimed in claim 1 wherein the step of forming an edited signal is further defined by forming an edited signal by subjecting said input signal to a first transfer function by high-pass filtering said input signal to obtain said resulting signal and amplifying said resulting signal by a defined gain factor.

3. A method as claimed in claim 1 wherein the step of subjecting said product to a second transfer function is further defined by subjecting said product to a second transfer function, which is the complex complement of said first transfer function, by digital filtering said product to obtain said digital filtered data, and wherein the step of calculating a final analog-to-digital conversion result is further defined by calculating a final analog-to-digital conversion result by summing said digital filter data and said second digital data.

4. A method as claimed in claim 3 comprising the additional steps of:
    for chronologically successive samples, forming the difference between said product and said sums obtained in the step of calculating said final analog-to-digital conversion result; and
    using the differences for successive samples to correct amplification offset errors.

5. A method as claimed in claim 4 wherein the step of using said differences to correct amplification offset errors is further defined by the steps of:
    forming an average of the differences obtained for a selected number of said chronologically successive samples, taking the operation signs of said differences into consideration; and
    using said average for correcting said amplification offset errors.

6. A method as claimed in claim 1 wherein said defined number of bits defines the dynamic range of said analog-to-digital conversion, and wherein said method comprises the additional steps of:
    superimposing a chronologically changing, analog electrical signal on said input signal, before subjecting said sampled input signal to an analog-to-digital conversion, to obtain a combination signal, said chronologically changing, analog electrical signal having a maximum amplitude which is at least equal to a voltage difference corresponding to a least significant bit of said analog-to-digital conversion and having a statistically uniform amplitude distribution;
    subjecting said combination signal to a third transfer function, having an integrating effect, by digitally filtering said combination signal to obtain integrated digital data;
    detecting transgressions of the dynamic range in the analog-to-digital conversion of said edited signal; and
    in the event of a transgression of said dynamic range in the analog-to-digital conversion of said edited signal, substituting said integrated digital data for said second digital data in the step of calculating a final analog-to-digital conversion result.

7. A method as claimed in claim 6 wherein the step of subjecting said combination signal to a third transfer function is further defined by subjecting said combination signal to a third transfer function by low pass filtering said combination signal.

8. A method as claimed in claim 6 wherein the step of superimposing a chronologically changing, analog electrical signal on said input signal is further defined by superimposing a periodically changing, analog electrical signal on said input signal.

9. A method as claimed in claim 1 comprising the additional steps of:
    superimposing a chronologically changing, analog electrical signal on said input signal to obtain a combination signal, said chronologically changing, analog electrical signal having a maximum amplitude which is at least equal to a voltage difference corresponding a least significant bit of the analog-to-digital conversion, and having a statistically uniform amplitude distribution;
    substituting said combination signal for said input signal in the formation of said edited signal, so that said second digital data are formed from said edited signal based on said combination signal;
    analog-to-digital converting said combination signal to obtain third digital data;
    multiplying said third digital data by said multiplication factor to obtain a further product;
    subjecting said further product to a third transfer function, having an integrating effect, by digitally filtering said further product to obtain further digitally filtered data;
    for individual samples, comparing said further digitally filtered data with said second digital data to obtain a comparison result; and
    to the extent said comparison result deviates from said chronologically changing, analog electrical signal, adjusting a selected parameter used to form said edited signal or to form said product to minimize the deviation.

10. A method as claimed in claim 9, wherein said defined number of bits defines the dynamic range of the analog-to-digital conversion, and wherein said method comprises the additional step of:
    using said chronologically changing, analog electrical signal additionally to form substitute digital data used in place of said second digital data in the step of calculating a final analog-to-digital conversion result, in the event said edited signal transgresses said dynamic range of said analog-to-digital conversion.

11. A method as claimed in claim 9 comprising the additional step of setting said input signal to zero.

12. An apparatus for analog-to-digital conversion of a chronologically changing, analog electrical input signal comprising:
    means for subjecting said input signal to a first transfer function to obtain a resulting signal;
    means for amplifying the resulting signal by a defined gain factor to form an edited signal;
    means for chronologically successively sampling said input signal to obtain a sampled input signal;
    means for chronologically successively sampling said edited signal to obtain a sampled edited signal;
    means for subjecting said sampled input signal and said sampled edited signal to analog-to-digital conversion to obtain first digital data, corresponding to said input signal, having a defined number of bits and to obtain second digital data, corresponding to said edited signal, having said defined number of bits;
    means for multiplying said first digital data by a defined multiplication factor, equal to said defined gain factor, to obtain a product;
    digital filter means for subjecting said product to a second transfer function to obtain digitally filtered data; and
    means for calculating a final analog-to-digital conversion result based on said digitally filtered data and said second digital data.

13. An apparatus as claimed in claim 12 wherein said means for subjecting said input signal to a first transfer function is a high-pass filter.

14. An apparatus as claimed in claim 12 wherein said digital filter has a transfer function which is the complex complement of said first transfer function of said means for subjecting said input signal to said first transfer, and wherein said means for calculating a final analog-to-digital conversion result includes means for summing said digitally filtered data and said second digital data.

15. An apparatus as claimed in claim 14 further comprising:
    means for forming the difference, for chronologically successive samples, between said product and the sums obtained in said means for summing; and
    means for using the differences for successive samples to correct amplification offset errors occurring in said means for amplifying.

16. An apparatus as claimed in claim 15 wherein said means for using the differences to correct amplification offset errors includes means for forming an average of the differences obtained for a selected number of said chronologically successive samples, taking the operation signs of said differences into consideration, and means for using said average for correcting said amplification offset errors.

17. An apparatus as claimed in claim 12 wherein said defined number of bits defines the dynamic range of said means for analog-to-digital converting, and wherein said apparatus further comprises:
    means for superimposing a chronologically changing, analog electrical signal on said input signal before analog-to-digital conversion of said sampled input signal, to obtain a combination signal, said chronologically changing, analog electrical signal having a maximum amplitude which is at least equal to a voltage difference corresponding to a least significant bit of the analog-to-digital conversion and having a statistically uniform amplitude distribution;
    means for digitally filtering said combination signal to subject said combination signal to a third transfer function having an integrating effect, to obtain integrated digital data;
    means for detecting transgressions of the dynamic range in the analog-to-digital conversion of said edited signal; and
    means, in the event of a transgression of said dynamic range in the analog-to-digital conversion of said edited signal, for substituting said integrated digital data for said second digital data in said means for calculating a final analog-to-digital conversion result.

18. An apparatus as claimed in claim 17 wherein said means for digitally filtering said combination signal is a means for low-pass filtering said combination signal.

19. An apparatus as claimed in claim 17 wherein said means for superimposing a chronologically changing, analog electrical signal on said input signal is a means for superimposing a periodically changing, analog electrical signal on said input signal.

* * * * *